Figure 1:
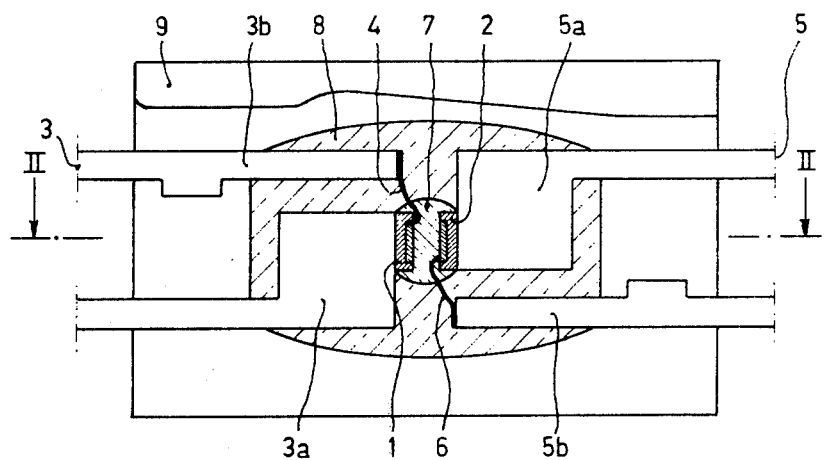

United States Patent [19]

Thillays

[11] 3,976,877

[45] Aug. 24, 1976

[54] OPTO-ELECTRONIC PHOTOCOUPLING DEVICE AND METHOD OF MANUFACTURING SAME

[75] Inventor: Jacques Claude Thillays, Herouville Saint Clair, France

[73] Assignee: U.S. Philips Corporation, New York, N.Y.

[22] Filed: Feb. 7, 1975

[21] Appl. No.: 547,992

[30] Foreign Application Priority Data

Feb. 22, 1974 France .............................. 74.06089

[52] U.S. Cl. .............................. 250/227; 250/239; 250/551; 250/552; 313/512
[51] Int. Cl.² ..................... H01L 31/12; G02B 5/14
[58] Field of Search ........... 250/239, 551, 552, 227, 250/211 J; 313/512

[56] References Cited
UNITED STATES PATENTS

| 3,153,149 | 10/1964 | Finigian ............................. 250/239 |
| 3,639,770 | 2/1972 | Zizelmann ...................... 250/239 X |
| 3,845,318 | 10/1974 | Thillays............................... 250/551 |
| 3,863,075 | 1/1975 | Ironmonger et al. ........... 313/512 X |

OTHER PUBLICATIONS

Dion et al., *Module Package*, IBM Technical Disclosure Bull., vol. 7, No. 7, Dec. 1964 p. 557.

*Primary Examiner*—Eugene La Roche
*Attorney, Agent, or Firm*—Frank R. Trifari; Simon L. Cohen

[57] ABSTRACT

An opto-electronic photocoupling device in which the light emitter and receiver are coupled optically by a light conductor, and the conductor is constituted by a drop of a first transparent resin embedded in a second resin which is also transparent, the index of refraction of the first resin being higher than that of the second resin.

13 Claims, 2 Drawing Figures

U.S. Patent  Aug. 24, 1976  3,976,877

OPTO-ELECTRONIC PHOTOCOUPLING DEVICE AND METHOD OF MANUFACTURING SAME

The present invention relates to an optoelectronic photocoupling device comprising a semiconductor light emitter and a semiconductor photosensitive receiver, optically coupled by a light conductor and connected to electric outputs.

Various opto-electronic combinations are known which are composed of an emitter and a receiver and which are coupled optically with a view to transferring, through the intermediary of a light signal, an electric signal from a first circuit to an electrically isolated second circuit. Said combinations, so-called "photocouplers", usually employ an electroluminescent diode as emitter and a photodiode as receiver, the emitter and receiver generally being semiconductors. It is known that in order for a photocoupler to have the correct characteristics, it must satisfy a certain number of geometric, electric, thermal and ecomonic criteria. Actually, for example, from a geometric point of view, the emitter and the receiver must be on the same optical axis in such manner that the emission cone coincides with the reception cone of the receiver defined by the surfaces of the photo-emissive and photosensitive junction. From an electric point of view it is necessary to determine an optimum distance between the emitter and the receiver, since this influences both the insulation value and the transfer value.

From a mechanical point of view, two types of assembling photocouplers are known. The first type consists of the face-to-face arrangement of two crystals, one the emitter, the other the receiver, or two assemblies of crystals connected by a transparent cement serving as an index adaptor. The second type consists of the face-to-face arrangement of two crystals which are connected optically by a light conductor and are subsequently embedded in a hardenable resin or enclosed in an air-tight casing.

The object of these two types of assemblies is to provide a satisfactory compromise between the insulation value and the transfer value. They are frequently used but nevertheless present a certain number of drawbacks.

A photocoupler comprising a light conductor of a plastic elastic material which is transparent to radiations, in which the casing enveloping the assembly consists at least partially of ceramic, is known, for example, from the French Patent No. 2,063,024. The light conductor is adhered at one end to the surface of the light emitter and at its other end to the photosensitive receiver. The light conductor is placed in a gaseous atmosphere the volume of which is determined by the casing, which impairs the insulation qualities of the photocoupler: actually experience has demonstrated that in a similar case leakage currents propagate along the resin conductor, not in the interior thereof but in the gaseous layer, the dielectric rigidity of such a gaseous medium being very low (1 kV per mm). Actually, there exists a need for certain photocouplers conveying very high voltages.

A coupler for television, for example, which must isolate 10 kV should have a fiber of 1 cm length resulting in an intolerable light attenuation and in problems of mechanical rigidity which cannot be solved industrially. Moreover, from a technological point of view, such an assembly would be difficult to realize in an industrial manner, it being understood that the adjusting of the components, their placement and their alignment are operations which require much care and precision.

It is the object of the present invention to remedy these drawbacks. The embodiment of the invention is based mainly on the qualities of dielectric rigidity and mechanical rigidity of certain resins and on the properties of mirrors having the form of paraboloids of revolution. It must be clear that in the present description the expression resin indicates a plastic material which is hardenable essentially due to a polymerization process initiated by heat or by a foreign body called catalyzer.

Actually, the present invention relates to an opto-electronic photocoupler device comprising opposite to each other a semiconductor light-emitter and a semiconductor photosensitive receiver which are coupled optically by a light conductor and are each connected to electric outputs, characterized in that the light conductor is constituted by a drop of a first transparent resin having a relatively high index of refraction and embedded in a second transparent resin, the value of the index of refraction of the said second transparent resin being lower than that of the index of refraction of the said first transparent resin.

This invention presents numerous advantages; since the dielectric rigidity of the resins is twenty times higher than that of air, it becomes possible to manufacture high voltage diodes having a high dielectric rigidity and a small volume.

With an identical topology, the efficiency of the light conductor varies directly with the difference between the index of refraction of the conductor and the index of the medium which surrounds it.

The range of resins refractive indexes comprises resins the index of refraction of which is 1.6 (higher than 1.55) such as epoxy resins which are suitable to constitute the fiber optic conductor, and resins the index of refraction of which is 1.4 (lower than 1.45) such as elastomers on the basis of silicones which are suitable to constitute the transparent envelope.

The use of resins presents an additional advantage due to their adhering quality; in fact, in the above-mentioned French Patent an adhesive is provided between the light conductor on the one hand and the two semiconductor crystals on the other hand. The difference in index of refraction between the adhesive and the conductor produces a deviation and a loss of light rays. The value of the index of refraction of glass (of the order of 1.4) which is low enough is in itself unfavorable for a good optical adaptation opposite to that of silicon (higher than 2), the most frequently used semiconductor. The presence of adhesives, generally of low index, produces discontinuities of the index of refraction which result in losses.

In the device according to the present invention, the adhering qualities of the resins make the layers of adhesive superfluous and their high index, 1.6, permits of a better optical adaptation which reduces losses. Moreover, the form of the conductor is adjusted to that of the oppositely located crystals and this form may effect a different geometry according to need.

The efficacity of the light conductor of the device according to the present invention is ameliorated if the light conductor has an oblong form. The most efficient assembly is constituted by two coaxial paraboloids of revolution which are symmetric with respect to one plane.

Advantageously, the junction between the two paraboloids has a substantially spherical shape.

The reflection in the direction parallel to the axis of all the rays emitted in the center of a paraboloid is a well-known geometric property. According to the present invention, the emitter on the one hand and the receiver on the other hand are situated, at least approximately, in the center of the two paraboloids. If in the practical realization the device according to the invention is not geometrically perfect and if, for that reason, the light ray does not issue exactly from the center or even if the shape at the point of impact of the light ray is not entirely parabolic, the angular difference is sufficiently small that the light ray remains confined in the conductor.

In these conditions, any ray emitted by the light-emitting crystal cannot leave the conductor formed by the assembly of the first and the second resins. Consequently, the transfer efficiency is excellent. Moreover by suitably choosing the shape and the length of the light conductor it is possible to elongate the light emitter of the photoreceiver, so to improve the value of the insulation without reducing that of the transfer.

Advantageously, the assembly constituted by the emitter, the receiver, the first and the second resin, is surrounded by an opaque envolope. This envelope avoids the entrance of stray light which may disturb the operation of the photocoupler. It also avoids the emanation of light which may impede other devices. Said envelope may be a metal casing which, if desired, reflects any stray ray towards the interior. It may also be an opaque resin, notably an epoxy resin. This provides the advantage of simplified manufacture at low cost.

The emitter on the one hand and the receiver on the other hand may be soldered to the extremity of metal supports each constituting one of the contacts, and in a preferred embodiment the supports are constituted by metal lugs to the edge of which the emitter and the said receiver are soldered. Preferably, the assembly of the first and the second resin is also such that the transparent resin envelops the assembly of the emitter, the receiver and at least a part of their supports and contact lugs.

One of the advantages of this embodiment resides in the facility with which it can be series-produced, by adaptation of the so-called comb technique, according to which the semiconductors are soldered to the edge of lugs which are cut out of tapes. This results in a low cost-price.

The present invention also relates to a method of manufacturing the electronic photocoupler device comprising a semiconductor light emitting crystal and a semiconductor receiving crystal connected together optically and mechanically and embedded in an opaque resin. During the viscous phase of polymerization of a first transparent resin, it is given an optically suitable shape. After total polymerization, the first resin and the semiconductor crystals are covered with a second transparent resin having an index of refraction which is lower than that of the first resin and forms with it a light conductor. The assembly is embedded, if desired, in an opaque resin.

Preferably, the shape of the drop of the first transparent resin is formed by a transverse movement of the photocoupler with respect to the emitter and is advantageously formed during the assembly of the receiver with the emitter. The drop easily takes the desired shape.

In this case there is not any complementary operation and the method is simplified.

Figure 2:
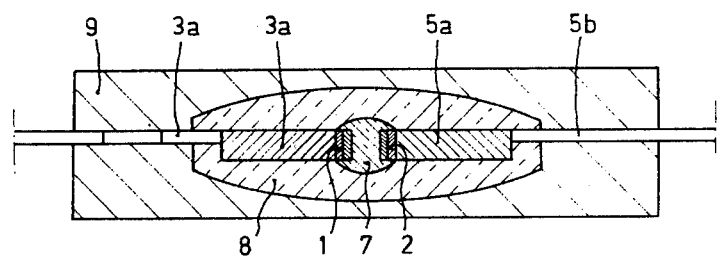

In order that the invention may be readily carried into effect, it will now be described in greater detail, by way of example, with reference to the accompanying drawings, in which FIG. 1 is an underneath view, partly broken away, of a device according to the invention, FIG. 2 is a diagrammatic sectional view taken on the line II—II of the same device.

It is to be noted that the dimensions in the Figures are considerably exaggerated and not drawn in proportion for reasons of clarity.

The device shown in FIGS. 1 and 2 comprises a light emitter 1, for example, an electroluminescent diode formed by starting from a monocrystal of gallium arsenide and constituted by two regions of opposite conductivity types and, a photo receiver 2 which has been manufactured by starting from a silicon crystal and which, in these Figures, is a photodiode. One of the two regions of the emitter 1 is soldered to the edge of a first connection lug 3a of a conductor pair 3 of which the second lug 3b is connected electrically, via the wire 4, to the second region of the said emitter 1.

The photodiode 2 is soldered with one of its regions to the edge of a lug 5a of a conductor pair 5 of which the lug 5b is connected to the other region via a wire 6.

The emitter 1 and the photoreceiver 2 thus fixed to their respective conductor pairs 3 and 5 forming part of strips in the form of "combs" are opposite to each other and are embedded in a drop of a first transparent resin 7 having a high index of refraction, for example, a novolak epoxide resin with amine catalyser known commercially as Araldite and having an index sustantially equal to 1.6. A second likewise transparent resin 8 covers the crystals 1 and 2 and the resin 7. The second resin, for example, silicone elastomer of index 1.4, known commercially as Rhodorsil, has a lower index of refraction than the first resin and constitutes with the resin 7 the light conductor which forms the object of the invention.

These various elements and the ends of the conductor pairs 3 and 5 are embedded in an opaque resin 9 which constitutes the air-tight casing in the form of a parallelepiped.

In order to obtain this device, first the crystals are soldered to the edge of the connections 3a and 5a of the conductor pairs 3 and 5. After having connected the wires 4 and 6 to the suitable regions of crystals 1 and 2 and to the connections 3b and 5b of the conductor pairs 3 and 5, the crystals 1 and 2 are placed opposite to each other and are embedded in a drop of a first transparent resin 7. When the polymerization of said resin is in its viscous phase the two crystals are moved towards each other until a maximum transfer efficiency is obtained: this movement compresses the drop of resin 7 and gives it the form shown in the Figures, approaching that of the two paraboloids of revolution having a spherical junction in the center of which are present substantially the junctions formed on the crystals, the surface of the junctions being very small with respect to that of the crystals.

After the total polymerization of the drop 7 for two hours at 150°C, the drop, the crystals 1 and 2 and the extremity of the connections 3a, 3b and 5a, 5b are covered with a second transparent resin 8 which is then made to polymerize at 100°C for one hour. For transfer molding, the opaque resin 9 is finally provided which constitutes the casing of the assembly.

The device according to the invention may thus be obtained with a very high precision, conveniently, in an industrial manner, and at a low cost-price.

What is claimed is:
1. An opto-electronic photocoupling device of the type comprising a semiconductor light emitter and a semiconductor photosensitive receiver, which are coupled optically by a light conductor and are each connected to electric outputs, the improvement wherein the light conductor is constituted by an oblong mass of a first transparent resin having a relatively high index of refraction and embedded in a second transparent resin, the value of the index of refraction of the said second transparent resin being lower than that of the index of refraction of the said first transparent resin, said light emitter and said photosensitive receiver being embedded in opposed manner in said first resin.
2. An opto-electronic device as claimed in claim 1, wherein said first mass of resin is substantially an oblong solid of revolution constituted by two paraboloids which are symmetric with respect to a plane of which the emitter and the receiver occupy substantially the two focal planes.
3. A device as claimed in claim 1, wherein the index of refraction of the first resin is higher than 1.55 and the index of refraction of the second resin is lower than 1.45.
4. A device as claimed in claim 1, wherein the first transparent resin is an epoxy resin.
5. A device as claimed in claim 1, wherein the second transparent resin is a silicone elastomer.
6. A device as claimed in claim 1, wherein the emitter, the receiver, the first and the second resin are embedded in an opaque envelope.
7. A device as claimed in claim 6, wherein the said opaque envelope is an opaque resin.
8. A device as claimed in claim 1, wherein the emitter and the receiver are soldered to the extremity of metal supports each constituting a contacts for connecting the emitter and the receiver to said electrical outputs.
9. A device as claimed in claim 8, wherein said supports are constituted by metal lugs to the edge of which the said emitter and said receiver are soldered.
10. A device as claimed in claim 8, wherein the second transparent resin envelops the assembly of the emitter, the receiver, and at least a part of their supports and contact lugs.
11. A method for manufacturing an optoelectronic photocoupling device comprising placing a drop of a first transparent resin having a relatively high index of refraction between and in contact with a semiconductor light emitter and a semiconductor photosensitive receiver, polymerizing said first resin through a viscous phase to a solid phase, shaping said first resin in said viscous phase into an oblong mass, polymerizing a second resin having a relatively low index of refraction around said emitter, said receiver and said first resin, and surrounding said second resin with an opaque solid material.
12. A method as recited in claim 11, wherein the step of shaping comprises relatively moving said emitter and receiver with the viscous drop of first resin therebetween.
13. A method as recited in claim 11, further comprising forming metal lugs from sheet metal and soldering said lugs to said emitter and receiver.

* * * * *

UNITED STATES PATENT AND TRADEMARK OFFICE
CERTIFICATE OF CORRECTION

PATENT NO. : 3,976,877
DATED : August 24, 1976
INVENTOR(S) : JACQUES CLAUDE THILLAYS It is certified that error appears in the above–identified patent and that said Letters Patent are hereby corrected as shown below:

Col. 1, line 8, after "ceiver" cancel " , " the comma;

Col. 2, line 35, "resins" should be --resin--;

Col. 3, line 3, "in the" should be --in a--;

line 11, after "center" insert -- ; --;

Signed and Sealed this

Twenty-eighth Day of December 1976

[SEAL]

Attest:

RUTH C. MASON
*Attesting Officer*

C. MARSHALL DANN
*Commissioner of Patents and Trademarks*